United States Patent
Ha et al.

(10) Patent No.: US 7,582,890 B2
(45) Date of Patent: Sep. 1, 2009

(54) MAGNETIC TUNNEL JUNCTION STRUCTURES HAVING BENDED TIPS AT BOTH ENDS THEREOF, MAGNETIC RANDOM ACCESS MEMORY CELLS EMPLOYING THE SAME AND PHOTOMASKS USED IN FORMATION THEREOF

(75) Inventors: Young-Ki Ha, Suwon-si (KR); Jang-Eun Lee, Suwon-si (KR); Se-Chung Oh, Yongin-si (KR); Jun-Soo Bae, Hwaseong-si (KR); Hyun-Jo Kim, Hwaseong-si (KR); Kyung-Tae Nam, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 245 days.

(21) Appl. No.: 11/103,078

(22) Filed: Apr. 11, 2005

(65) Prior Publication Data
US 2005/0230771 A1    Oct. 20, 2005

(30) Foreign Application Priority Data
Apr. 19, 2004    (KR)    ........................ 10-2004-0026689

(51) Int. Cl.
*H01L 27/20* (2006.01)
(52) U.S. Cl. .................. 257/9; 257/2; 257/3; 257/4; 257/5; 257/7; 257/E21.665
(58) Field of Classification Search ................ 257/421, 257/2–5, 295, E21.665; 365/158
See application file for complete search history.

(56) References Cited

U.S. PATENT DOCUMENTS

| | | | |
|---|---|---|---|
| 6,531,723 B1 | 3/2003 | Engel et al. | ................. 257/200 |
| 6,605,835 B2 | 8/2003 | Lee | |
| 6,605,836 B2 | 8/2003 | Kishi et al. | |
| 2002/0028357 A1 | 3/2002 | Shukh et al. | |
| 2002/0051380 A1 | 5/2002 | Kamiguchi | |

(Continued)

FOREIGN PATENT DOCUMENTS

DE    10305823    2/2003

(Continued)

OTHER PUBLICATIONS

Park, M. H., Hong, Y. K., Gee, S. H., Erickson, D. W., Choi, B. C.—Magnetization Configuration and Switching Behaviour of Submicron NiFe elements: Pac-man Shape, Jul. 14, 2003.

(Continued)

*Primary Examiner*—Wael Fahmy
*Assistant Examiner*—Minchul Yang
(74) *Attorney, Agent, or Firm*—Mills & Onello, LLP.

(57) ABSTRACT

Provided are magnetic tunnel junction structures having bended tips at both ends thereof, magnetic RAM cells employing the same and photo masks used in formation thereof. The magnetic tunnel junction structures have a pinned layer pattern, a tunneling insulation layer pattern and a free layer pattern, which are stacked on an integrated circuit substrate. At least the free layer pattern has a main body as well as first and second bended tips each protruded from both ends of the main body when viewed from a plan view.

34 Claims, 11 Drawing Sheets

U.S. PATENT DOCUMENTS

| | | | |
|---|---|---|---|
| 2003/0107849 A1* | 6/2003 | Ikarashi | 360/324.1 |
| 2003/0169147 A1 | 9/2003 | Higo | 338/32 R |
| 2004/0012994 A1* | 1/2004 | Slaughter et al. | 365/158 |
| 2004/0047085 A1 | 3/2004 | Liao et al. | |
| 2004/0100855 A1* | 5/2004 | Saito et al. | 365/232 |

FOREIGN PATENT DOCUMENTS

| | | |
|---|---|---|
| JP | 2002-37660 | 2/2002 |
| JP | 2002-353537 | 12/2002 |
| KR | 01-30391 | 4/2001 |
| WO | 03044800 | 5/2003 |
| WO | 2005086171 | 9/2005 |

OTHER PUBLICATIONS

Jul. 14, 2003, p. 329-331, vol. 83, No. 2, American Institute of Physics, United States.

English-language translation Chinese Office Action for Chinese Application No. 200510081709.X, Mar. 28, 2008.

* cited by examiner

MAGNETIC TUNNEL JUNCTION STRUCTURES HAVING BENDED TIPS AT BOTH ENDS THEREOF, MAGNETIC RANDOM ACCESS MEMORY CELLS EMPLOYING THE SAME AND PHOTOMASKS USED IN FORMATION THEREOF

CROSS-REFERENCE TO RELATED APPLICATION

This application claims the benefit of Korean Patent Application No. 2004-26689, filed Apr. 19, 2004, the contents of which are hereby incorporated herein by reference in their entirety.

BACKGROUND OF THE INVENTION

1. Field of the Invention

The present invention relates to magnetic random access memory (MRAM) devices and, more particularly, to magnetic tunnel junction structures having bended tips at both ends thereof, MRAM cells employing the same, and photo masks used in formation thereof.

2. Description of the Related Art

MRAM devices have been widely used as nonvolatile memory devices, which can be operated at a low voltage and at a high speed. In a unit cell of the MRAM devices, data is stored in a magnetic tunnel junction (MTJ) structure of a magnetic resistor. The MTJ structure includes first and second ferromagnetic layers and a tunneling insulation layer interposed therebetween. Magnetic polarization of the first ferromagnetic layer referred to as a free layer may be changed by an external magnetic field that crosses the MTJ structure. The external magnetic field may be induced by a current that flows around the MTJ structure, and the magnetic polarization of the free layer may be parallel or anti-parallel to the fixed magnetic polarization of the second ferromagnetic layer referred to as a pinned layer. Current for creating the magnetic field flows through conductive layers called a digit line and a bit line, which are disposed around the MTJ structure.

According to spintronics based on quantum mechanics, when magnetic spins in the free layer and the pinned layer are arrayed to be parallel to each other, a tunneling current passing through the MTJ structure exhibits a maximum value. On the other hand, when the magnetic spins in the free layer and the pinned layer are arrayed to be anti-parallel to each other, the tunneling current passing through the MTJ structure has a minimum value. Accordingly, data of the MRAM cell can be determined according to the direction of the magnetic spins in the free layer.

Most of the MTJ structures have a rectangular shape or an ellipse shape when viewed from a plan view. This is because the magnetic spins in the free layer have a stable state when the magnetic spins in the free layer are parallel to a longitudinal direction of the free layer.

The MRAM device includes a plurality of MTJ structures. The plurality of MTJ structures may exhibit non-uniform switching characteristics according to a fabrication process thereof. In this case, external magnetic fields for storing desired data in the MTJ structures may be different from one another. Accordingly, the more switching characteristics of the MTJ structures are non-uniform, the more the writing margin of the MRAM device is reduced. In particular, when the MTJ structures are scaled down for high integration density, the writing margin may be significantly reduced.

In the event that the MTJ structure employs a pinned layer composed of a single ferromagnetic layer, a hysteresis curve of the MTJ structure may be shifted due to a parasitic magnetic field by fixed magnetic spins in the pinned layer. That is, even though an external magnetic field is not applied to the MTJ structure, the magnetic spins in the free layer may be under the influence of the parasitic magnetic filed which is due to the fixed magnetic spins in the pinned layer. Accordingly, an absolute value of a first external magnetic field to array the magnetic spins in the free layer to be parallel with the fixed magnetic spins in the pinned layer may be different from that of a second external magnetic field to array the magnetic spins in the free layer to be anti-parallel with the fixed magnetic spins in the pinned layer. In order to solve the above-mentioned problem, a synthetic anti-ferromagnetic (SAF) layer has been widely used as the pinned layer.

In addition, the free layer may also employ the synthetic anti-ferromagnetic layer. In this case, the free layer composed of the synthetic anti-ferromagnetic layer exhibits better thermal stability and less magnetic polarization deviation as compared to the free layer composed of the single ferromagnetic layer.

A magnetic tunnel junction (MTJ) structure having a pinned layer and a free layer, which are made of the synthetic anti-ferromagnetic layer, is described in U.S. Pat. No. 6,531,723 B1 to Engel et al., entitled "Magnetoresistance Random Access Memory for Improved Scalability". Nevertheless, in the event that the MTJ structure according to Engel et al. has a rectangular or ellipse shape when viewed from a plan view, there may be some limitations in improving the writing margin.

Moreover, MRAM devices employing MTJ structures with different shapes from the rectangular and ellipse shapes are described in U.S. Patent Publication No. US 2003/0169147 A1 to Higo, entitled "Magnetoresistive Effect Element and Magnetic Memory Device." According to Higo, a vertical write electrode passes through a region between a pair of C-shaped free layers, which face each other. The write electrode is electrically connected to a pinned layer that is insulated from the free layers and located below the free layers. In addition, read lines electrically connected to the free layers are provided at both sides of the write electrode. Accordingly, the MTJ structure by Higo may require a complex manufacturing process. Further, the MTJ structure according to Higo is switched by only a vertical current that flows through the vertical write electrode. Thus, a large writing current may be required to change data stored in the MTJ structure. This may lead to an increase of power consumption during a writing operation.

SUMMARY OF THE INVENTION

In one aspect, the invention is directed to magnetic tunnel junction structures having bended tips at both ends thereof. The magnetic tunnel junction structures include a pinned layer pattern, a tunneling insulation layer pattern, and a free layer pattern, which are stacked on an integrated circuit substrate. At least the free layer pattern includes a main body as well as first and second tips respectively protruded from both ends of the main body when viewed from a plan view. The main body has first and second sides facing each other when viewed in plan, a third side extended from one end of the first side to contact one end of the second side, and a fourth side extended from the other end of the first side to contact the other end of the second side. Further, the first tip is protruded from a first vertex corresponding to a contact point of the second and third sides, and is in contact with the second and third sides. The second tip is protruded from a second vertex corresponding to a contact point of the second and fourth sides, and is in contact with the second and fourth sides.

In some embodiments, the first and second sides may be longer than the third and fourth sides. Also, the first side may have the same length as the second side, and the third side may have the same length as the fourth side.

In other embodiments, the tunneling insulation layer pattern may be interposed between the free layer pattern and the pinned layer pattern, and the tunneling insulation layer pattern and the pinned layer pattern may have the same configuration as the free layer pattern when viewed from a plan view.

In still other embodiments, the pinned layer pattern may be a single ferromagnetic layer or a synthetic anti-ferromagnetic (SAF) layer. The free layer pattern may be a single ferromagnetic layer or a synthetic anti-ferromagnetic (SAF) layer.

In further embodiments, a pinning layer pattern may come in contact with the pinned layer pattern. In this case, the pinning layer pattern is located opposite the tunneling insulation layer pattern. The pinning layer pattern is an anti-ferromagnetic layer.

In another aspect, the invention is directed to MRAM cells that employ magnetic tunnel junction structures having bended tips at both ends thereof. The MRAM cells include an access transistor formed at an integrated circuit substrate, and a digit line disposed over the substrate having the access transistor. A bottom electrode is disposed over the digit line. The bottom electrode is electrically connected to an output terminal of the access transistor. A magnetic tunnel junction structure is positioned on the bottom electrode. The magnetic tunnel junction structure includes a pinned layer pattern, a tunneling insulation layer pattern and a free layer pattern, which are stacked. At least the free layer pattern has a main body as well as first and second tips respectively protruded from both ends of the main body when viewed from a plan view. The main body has first and second sides facing each other, a third side extended from one end of the first side to come in contact with one end of the second side, and a fourth side extended from the other end of the first side to come in contact with the other end of the second side. Also, the first tip is protruded from a first vertex corresponding to a contact point of the second and third sides, and comes in contact with the second and third sides. The second tip is protruded from a second vertex corresponding to a contact point of the second and fourth sides, and comes in contact with the second and fourth sides. A top electrode is disposed on the magnetic tunnel junction structure. A bit line is disposed over the top electrode, and the bit line is electrically connected to the top electrode.

In some embodiments, the access transistor may be a MOS transistor. In this case, the output terminal corresponds to a drain region of the MOS transistor.

In other embodiments, the bit line may be disposed to cross over the digit line.

In still other embodiments, the main body may have a rectangular shape. In this case, the first and second sides may be longer than the third and fourth sides.

In further embodiments, the tunneling insulation layer pattern may be interposed between the free layer pattern and the pinned layer pattern. Also, the tunneling insulation layer pattern and the pinned layer pattern may have the same configuration as the free layer pattern when viewed from a plan view.

In still another aspect, the invention is directed to photo masks used in formation of magnetic tunnel junction structures having bended tips at both ends thereof. The photo masks include a transparent substrate and a magnetic tunnel junction pattern formed on a main surface of the transparent substrate. The magnetic tunnel junction pattern includes a square-shaped main pattern having first and second sides facing each other, and third and fourth sides facing each other, a first tip pattern protruded from a first vertex corresponding to a contact point of the second and third sides, and a second tip pattern protruded from a second vertex corresponding to a contact point of the second and fourth sides. The first tip pattern has a portion overlapping a first corner region of the main pattern including the first vertex, and the second tip pattern has a portion overlapping a second corner region of the main pattern including the second vertex.

In some embodiments, the main pattern may be a rectangular shape. That is, the first and second sides may be longer than the third and fourth sides. In this case, the first and second tip patterns may be symmetric to each other with respect to a straight line crossing a center point of the main pattern.

In other embodiments, the first and second tip patterns may have a square-shaped configuration or a circular configuration when viewed from a plan view.

In further embodiments, the main pattern, the first tip pattern, and the second tip pattern may be opaque patterns. In this case, the opaque patterns may be chrome patterns.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity. In addition, when a layer is described to be formed on another layer or on a substrate, the layer may be formed on the other layer or on the substrate, or a third layer may be interposed between the layer and the other layer or the substrate.

DETAILED DESCRIPTION OF THE INVENTION

Figure 1:
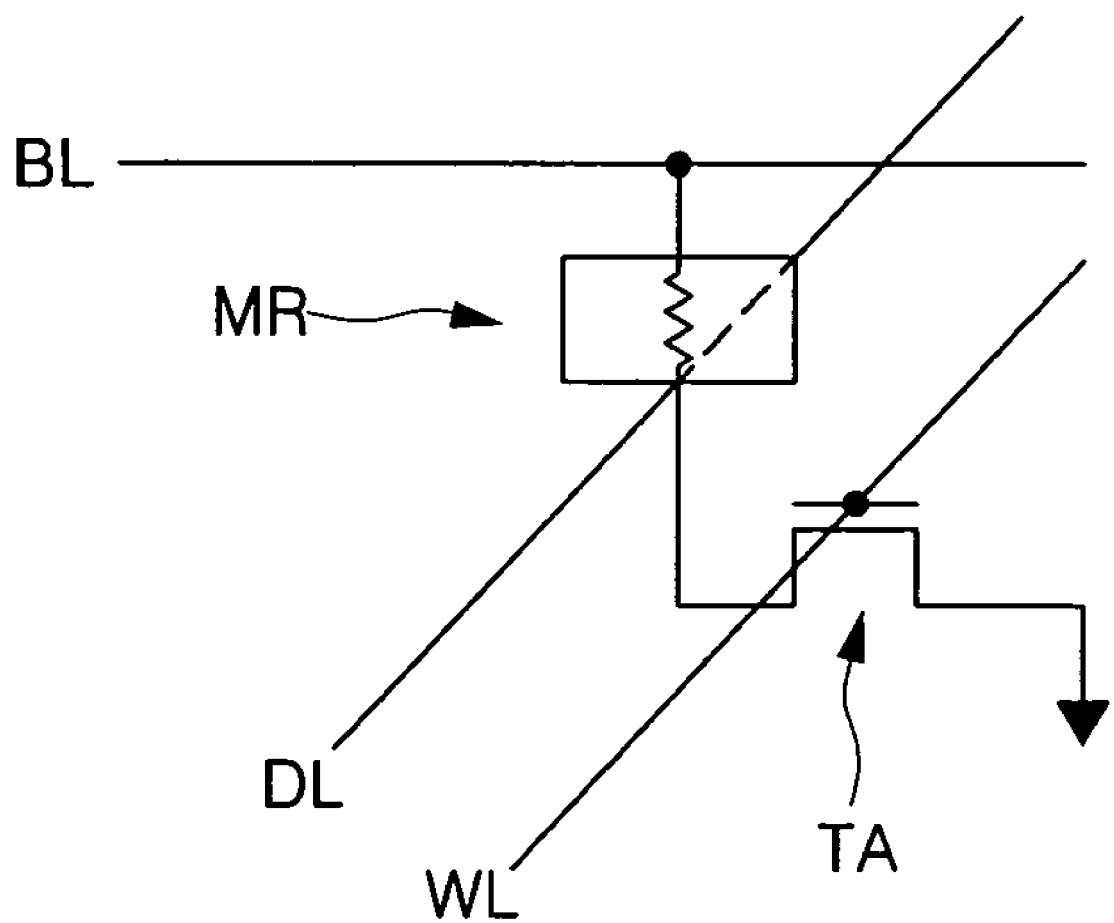
FIG. 1 is an equivalent circuit diagram of an MRAM cell according to embodiments of the present invention.

FIG. 1 is an equivalent circuit diagram of an MRAM cell according to embodiments of the present invention.

Referring to FIG. 1, an access transistor TA is provided. An output terminal of the access transistor TA is electrically connected to one end of a magnetic resistor (MR). The access transistor TA may be a MOS transistor having a gate electrode, a source region and a drain region. In this case, the drain region corresponds to the output terminal of the access transistor TA. Also, the gate electrode is extended to serve as a word line (WL), and the source region may be electrically connected to a ground terminal or a common source line. A digit line DL is disposed around the magnetic resistor MR. The digit line DL is insulated from the magnetic resistor MR. The other end of the magnetic resistor MR is electrically connected to a bit line BL.

Figure 2A:
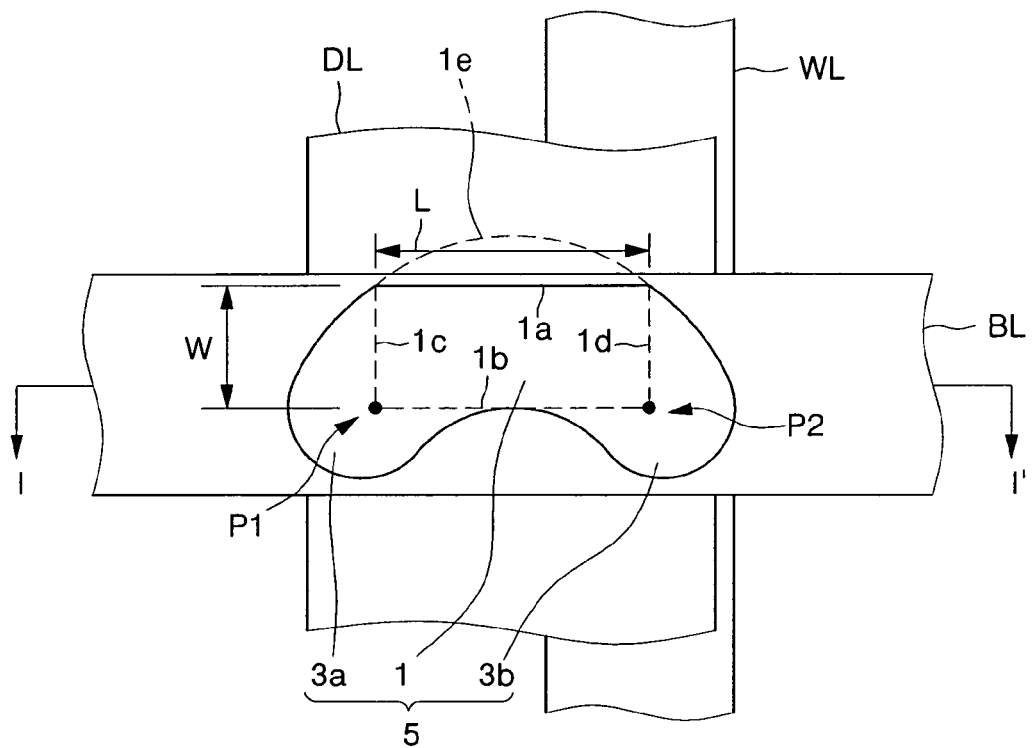
FIG. 2A is a plan view of an MRAM cell according to embodiments of the present invention.
Figure 2B:
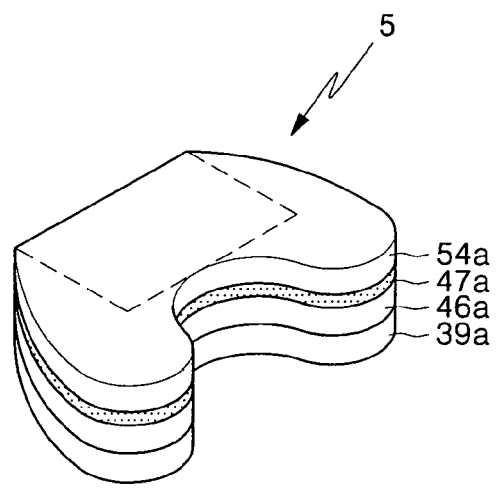
FIG. 2B is a perspective view of a magnetic tunnel junction structure shown in FIG. 2A.

FIG. 2A is a plan view illustrating MRAM cells according to embodiments of the present invention, and FIG. 2B is a perspective view of a magnetic tunnel junction structure shown in FIG. 2A. Further, FIG. 3 is a cross-sectional view taken along the line I-I' of FIG. 2A.

Figure 3:
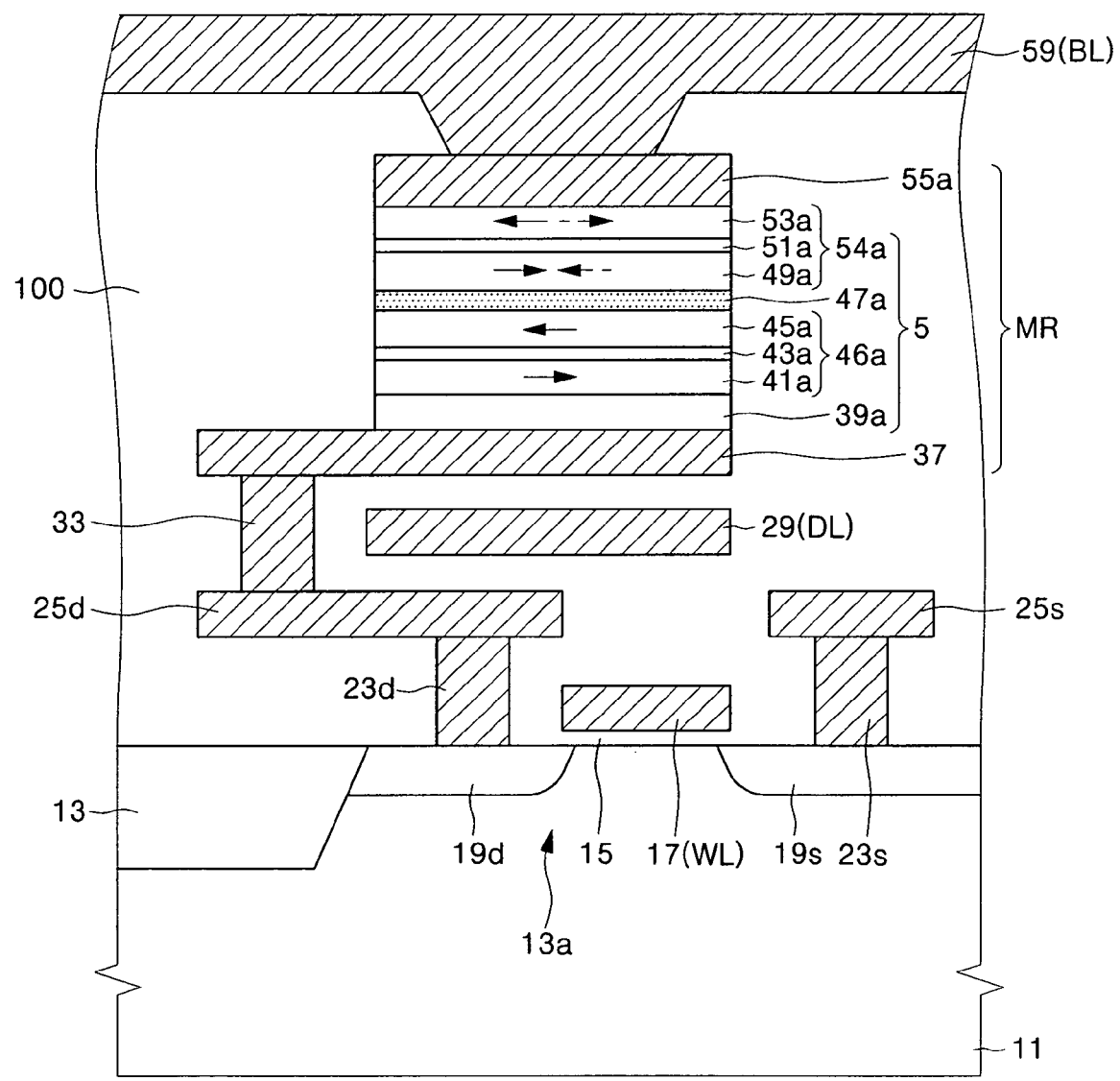
FIG. 3 is a cross-sectional view taken along the line I-I' of FIG. 2A.

Referring to FIGS. 2A, 2B and 3, an access transistor TA is provided at a predetermined region of an integrated circuit substrate 11. The access transistor TA may be a MOS transistor. In this case, the access MOS transistor TA is provided at an active region 13a defined by an isolation layer 13, which is formed at a predetermined region of the integrated circuit substrate 11. In detail, the access MOS transistor TA includes a source region 19s and a drain region 19d that are formed in the active region 13a and are spaced apart from each other, and a gate electrode 17 disposed over a channel region between the source region 19s and drain region 19d. The gate electrode 17 is extended to cross over the active region 13a to act as a word line (WL of FIGS. 1 and 2A). The gate electrode 17 is insulated from the active region 13a by a gate insulating layer 15.

A drain pad 25d and a common source line 25s are disposed over the substrate having the access MOS transistor TA. The drain pad 25d is electrically connected to the drain region 19d via a drain contact plug 23d, and the common source line 25s is electrically connected to the source region 19s via a source contact plug 23s. The drain region 19d corresponds to an output terminal of the access MOS transistor TA. The common source line 25s may be electrically connected to a ground terminal and may be disposed to be parallel with the word line WL.

A digit line 29 (DL of FIGS. 1 and 2A) is disposed over the substrate having the common source line 25s and the drain pad 25d. The digit line 29 may be disposed to be parallel with the word line WL. A magnetic resistor MR is positioned above the digit line 29. The magnetic resistor MR may include a bottom electrode 37, a magnetic tunnel junction structure 5 and a top electrode 55a, which are sequentially stacked. The bottom electrode 37 is electrically connected to the drain pad 25d via a bottom electrode contact plug 33. As a result, the bottom electrode 37 is electrically connected to the drain region 19d via the drain contact plug 23d, the drain pad 25d, and the bottom electrode contact plug 33. The digit line 29 is insulated from the magnetic resistor MR.

The magnetic tunnel junction structure 5 may include a pinning layer pattern 39a, a pinned layer pattern 46a, a tunneling insulation layer pattern 47a and a free layer pattern 54a, which are sequentially stacked on the bottom electrode 37. On the contrary, the free layer pattern 54a, the tunneling insulation layer pattern 47a, the pinned layer pattern 46a and the pinning layer pattern 39a may be sequentially stacked on the bottom electrode 37.

The pinning layer pattern 39a is composed of an anti-ferromagnetic layer, and the free layer pattern 54a and the pinned layer pattern 46a include a ferromagnetic layer. Accordingly, the pinned layer pattern 46a contacting the pinning layer pattern 39a may have fixed magnetic spins that are always arrayed toward a specific direction due to the presence of the pinning layer pattern 39a, namely, the anti-ferromagnetic layer. The tunneling insulation layer pattern 47a may be an insulating layer such as an aluminum oxide ($Al_2O_3$) layer.

The pinned layer pattern 46a may be a single ferromagnetic layer or a synthetic anti-ferromagnetic (SAF) layer. When the pinned layer pattern 46a is the synthetic anti-ferromagnetic (SAF) layer, the pinned layer pattern 46a includes a lower ferromagnetic layer 41a, an upper ferromagnetic layer 45a and an anti-ferromagnetic coupling spacer layer pattern 43a interposed therebetween. A ruthenium layer may be employed as the anti-ferromagnetic coupling spacer layer pattern 43a. In this case, the lower ferromagnetic layer pattern 41a includes fixed magnetic spins that are always arrayed toward a specific direction by the pinning layer pattern 39a, and the upper ferromagnetic layer 45a includes fixed magnetic spins, which are arrayed toward an opposite direction to the magnetic spins in the lower ferromagnetic layer 41a by the coupling spacer layer pattern 43a. Accordingly, a sum of vectors of the magnetic spins in the pinned layer pattern made of the synthetic anti-ferromagnetic (SAF) layer may be significantly smaller than a sum of vectors of the magnetic spins in the pinned layer pattern made of the single ferromagnetic layer. As a result, a magnetic tunnel junction structure employing the pinned layer pattern made of the SAF layer may exhibit a stable hysteresis curve.

The free layer pattern 54a may also be a single ferromagnetic layer or an SAF layer. When the free layer pattern 54a is the SAF layer, the free layer pattern 54a includes a lower ferromagnetic layer 49a, an upper ferromagnetic layer 53a, and an anti-ferromagnetic coupling spacer layer pattern 51a interposed therebetween. In this case, even though external thermal stress is applied to the free layer pattern 54a, the magnetic spins in the free layer pattern 54a may maintain a stable state. Further, magnetic spins in both ends of the free layer pattern 54a may have an unstable state due to etch damage applied while an etching process is performed to form the free layer pattern 54a. However, in the event that the free layer pattern 54a is the SAF layer, the magnetic spins in both ends of the free layer pattern 54a may have a stable state since the magnetic spins in the upper ferromagnetic layer 53a and the magnetic spins in the lower ferromagnetic layer 49a interact with each other to array along the opposite directions respectively.

In the event that both the pinned layer pattern 46a and the free layer pattern 54a employ the SAF layer, magnetic resistance of the magnetic tunnel junction structure 5 is determined according to an array direction of the magnetic spins in the upper ferromagnetic layer 45a of the pinned layer pattern 46a and an array direction of the magnetic spins in the lower ferromagnetic layer 49a of the free layer pattern 54a. That is, when the magnetic spins in the upper ferromagnetic layer 45a are parallel with those in the lower ferromagnetic layer 49a, the magnetic tunnel junction structure 5 has a minimum resistance value. On the contrary, when the magnetic spins in the upper ferromagnetic layer 45a are anti-parallel with those in the lower ferromagnetic layer 49a, the magnetic tunnel junction structure 5 has a maximum resistance value.

The magnetic tunnel junction structure 5 may include a main body 1 as well as first and second tips 3a and 3b respectively protruded from both ends of the main body 1 when viewed from a plan view, as shown in FIG. 2A. In detail, the main body 1 has first and second sides 1a and 1b that face each other, a third side 1c extended from one end of the first side 1a to contact one end of the second side 1b, and a fourth side 1d extended from the other end of the first side 1a to contact the other end of the second side 1b. The third side 1c faces the fourth side 1d. Also, the first tip 3a is protruded from a first vertex P1 corresponding to a contact point of the second and third sides 1b and 1c, and comes in contact with the second and third sides 1b and 1c. Similarly, the second tip 3b is protruded from a second vertex P2 corresponding to a contact point of the second and fourth sides 1b and 1d, and comes in contact with the second and fourth sides 1b and 1d. As a result, the first and second tips 3a and 3b are protruded from both ends of the main body 1 to constitute a pair of bended tips.

The main body 1 may have a square-shaped configuration when viewed from a plan view. The main body 1 may have a rectangular configuration. In this case, the first and second sides 1a and 1b may have a length L, and the third and fourth sides 1c and 1d may have a width W smaller than the length L.

It is preferable that the first side 1a facing the second side 1b that is in contact with the first and second tips 3a and 3b has a shape of a straight line. This is because at least the magnetic spins in the main body 1 should be preferably arrayed to be parallel or anti-parallel to an easy magnetic field induced by current flowing through the digit line 29. However, when the first side has a shape of a rounded curve (1e of FIG. 2A) instead of the straight line 1a, the magnetic spins in the main body 1 may exhibit vortex states. In this case, the magnetic spins in the free layer pattern 54a may show unstable states.

The pinned layer pattern 46a and the pinning layer pattern 39a may have a configuration different from that of the free layer pattern 54a when viewed from a plan view. In this case, it is preferable that at least the free layer pattern 54a has the main body 1 as well as the first and second tips 3a and 3b as shown in FIG. 2A.

The substrate having the above-described magnetic resistor MR is covered with an interlayer insulating layer 100. A bit line 59 (BL in FIGS. 1 and 2A) is disposed on the interlayer insulating layer 100. The bit line 59 is electrically connected to the magnetic resistor (MR), e.g., the top electrode 55a, via a bit line contact hole passing through the interlayer insulating layer 100. The bit line 59 is disposed to cross over the digit line 29.

Figure 4:
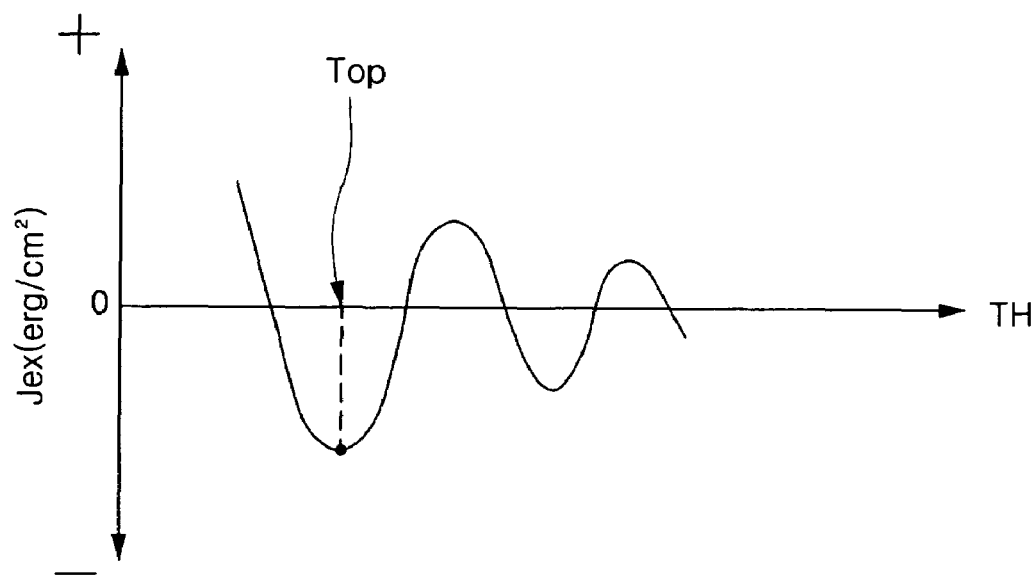
FIG. 4 is a graph showing exchange coupling energy according to a thickness of an anti-ferromagnetic coupling spacer layer of a typical synthetic anti-ferromagnetic (SAF) layer.

The property of the SAF layer may vary depending on a thickness of the anti-ferromagnetic coupling spacer layer 43a or 51a interposed between the upper ferromagnetic layer and the lower ferromagnetic layer, as shown in FIG. 4.

FIG. 4 is a graph showing exchange coupling energy of a typical SAF layer. In FIG. 4, the abscissa denotes a thickness TH of the ruthenium layer that serves as an anti-ferromagnetic coupling spacer layer of the SAF layer, and the ordinate denotes exchange coupling energy Jex of the SAF layer. When the exchange coupling energy Jex increases toward a positive direction, the magnetic spins in the upper ferromagnetic layer and the lower ferromagnetic layer are arranged to be more strongly parallel with each other. On the contrary, when the exchange coupling energy Jex increases toward a negative direction, the magnetic spins in the upper ferromagnetic layer and the lower ferromagnetic layer are arranged to be more strongly anti-parallel with each other.

As shown in FIG. 4, the exchange coupling energy Jex repeatedly and alternately exhibits a positive value and a negative value as the thickness TH of the ruthenium layer increases. Further, the exchange coupling energy Jex tends to decrease as the thickness TH of the ruthenium layer increases. Accordingly, in order to realize an excellent SAF layer suitable for high performance MRAM cells, the ruthenium layer must have an optimum thickness (Top in FIG. 4) at which the exchange coupling energy Jex exhibits a maximum negative value. The optimal thickness Top of the ruthenium layer may differ depending on materials of the upper ferromagnetic layer and the lower ferromagnetic layer.

When both the upper ferromagnetic layer and the lower ferromagnetic layer of the SAF layer are nickel iron (NiFe) layers, the optimal thickness of the ruthenium layer is about 8 Å. In this case, the SAF layer exhibits the exchange coupling energy Jex of $-0.036$ erg/cm$^2$. Further, when both the upper ferromagnetic layer and the lower ferromagnetic layer are CoFeB layers, the optimal thickness of the ruthenium layer is about 6 Å. In this case, the SAF layer exhibits the exchange coupling energy Jex of $-0.021$ erg/cm$^2$. In addition, when both the upper ferromagnetic layer and the lower ferromagnetic layer are cobalt iron (CoFe) layers, the optimal thickness of the ruthenium layer is about 8 Å. In this case, the SAF layer exhibits the exchange coupling energy Jex of $-0.18$ erg/cm$^2$. As a result, the CoFe layer has the exchange coupling energy Jex that is more suitable for the upper ferromagnetic layer and the lower ferromagnetic layer of the SAF layer as compared to the NiFe layer and the CoFeB layer. That is, it will be appreciated that the NiFe layer (or the CoFeB layer) is not suitable for the upper ferromagnetic layer and the lower ferromagnetic layer of the SAF layer.

However, the NiFe layer and the CoFeB layer show relatively stable hysteresis characteristics without kink phenomenon as compared to the CoFe layer. The kink phenomenon degrades the switching characteristics of the magnetic tunnel junction structure. Accordingly, in the event that a hybrid SAF layer is implemented by combining a ferromagnetic layer that exhibits an excellent hysteresis characteristic as a single free layer and a ferromagnetic layer that exhibits a high exchange coupling energy Jex as the SAF layer, the hybrid SAF layer may exhibits an excellent characteristic over the three-layered SAF layer 54a or 46a described with reference to FIG. 3.

Figure 5:
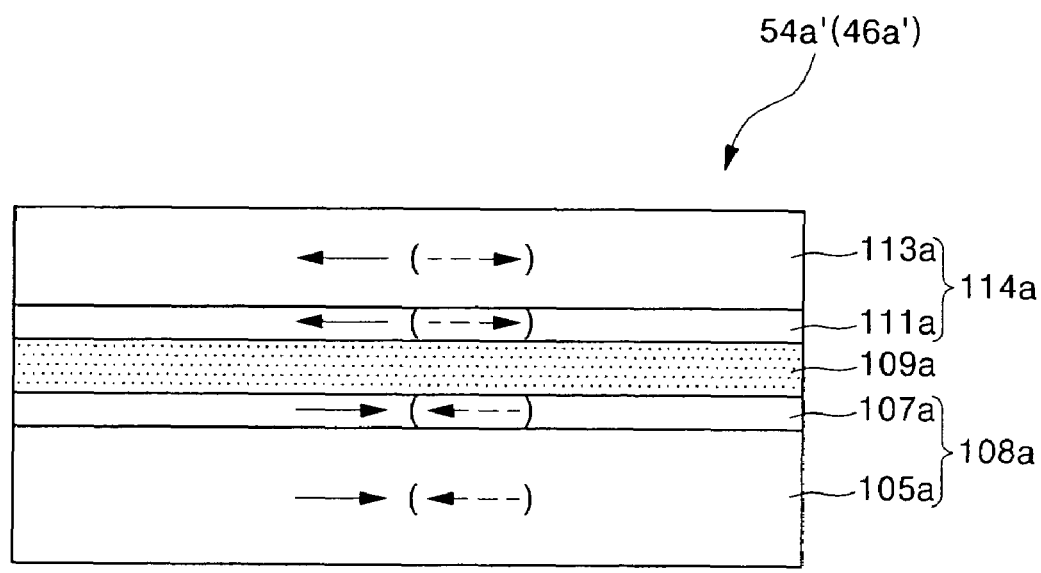
FIG. 5 is a cross-sectional view illustrating a hybrid synthetic anti-ferromagnetic (SAF) layer employed in a free layer and/or a pinned layer of an MRAM cell according to embodiments of the present invention.

FIG. 5 is a cross-sectional view illustrating the hybrid SAF layer 54a' or 46a' that may be employed instead of the three-layered SAF layer 54a or 46a shown in FIG. 3.

Referring to FIG. 5, the hybrid SAF layer 54a' or 46a' includes a lower hybrid ferromagnetic layer 108a, an anti-ferromagnetic coupling spacer layer 109a and an upper hybrid ferromagnetic layer 114a, which are sequentially stacked. The lower hybrid ferromagnetic layer 108a may include a first lower ferromagnetic layer 105a as well as a second lower ferromagnetic layer 107a interposed between the first lower ferromagnetic layer 105a and the anti-ferromagnetic coupling spacer layer 109a. Further, the upper hybrid ferromagnetic layer 114a may include a first upper ferromagnetic layer 113a as well as a second upper ferromagnetic layer 111a interposed between the first upper ferromagnetic layer 113a and the anti-ferromagnetic coupling spacer layer 109a. As a result, the hybrid SAF layer 54a' or 46a' is composed of at least five layers, which are sequentially stacked.

The anti-ferromagnetic coupling spacer layer 109a may be a ruthenium layer or a chrome layer. It is preferable that the first lower ferromagnetic layer 105a and the first upper ferromagnetic layer 113a are CoFeB layers or NiFe layers. Further, it is preferable that the second lower ferromagnetic layer 107a and the second upper ferromagnetic layer 111a are CoFe layers having the exchange coupling energy Jex which is higher than that of the first lower ferromagnetic layer 105a and the first upper ferromagnetic layer 113a.

As shown in FIG. 5, the first and second lower ferromagnetic layers 105a and 107a are in direct contact with each other. Accordingly, magnetic spins in the first lower ferromagnetic layer 105a are always arranged to be parallel with those in the second lower ferromagnetic layer 107a. Similarly, the first and second upper ferromagnetic layers 113a and 111a are also in direct contact with each other. Accordingly, the magnetic spins in the first upper ferromagnetic layer 113a are always arranged to be parallel with those in the second upper ferromagnetic layer 111a. As a result, even though the second lower ferromagnetic layer 107a and the second upper ferromagnetic layer 111a that are in direct contact with the anti-ferromagnetic coupling spacer layer 109a are formed to a thickness of several Å, the hybrid SAF layer 54a' or 46a' may show improved characteristics over the three-layered SAF layer 54a or 46a described with reference to FIG. 3 if the thickness of the first lower ferromagnetic layer 105a and the first upper ferromagnetic layer 113a is increased.

Figure 6:
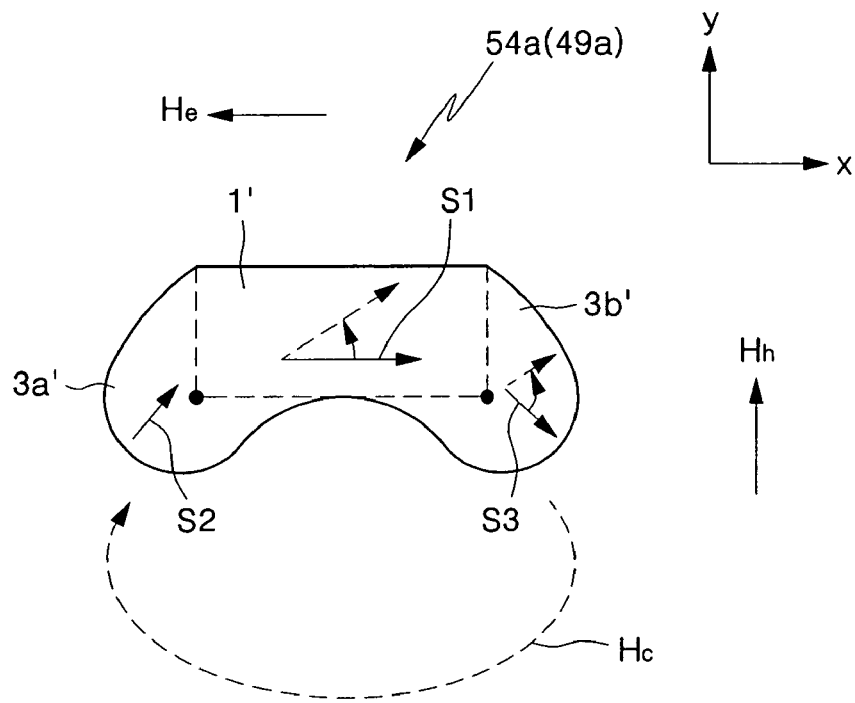
FIG. 6 is a plan view illustrating magnetization characteristics of the free layer shown in FIGS. 2B and 3.

FIG. 6 is a plan view illustrating a switching operation of the magnetic spins in the free layer pattern 54a of the magnetic tunnel junction structure 5 shown in FIG. 2B.

Referring to FIG. 6, the free layer pattern 54a is composed of a main body 1', a first tip 3a' and a second tip 3b' that correspond to the main body 1, the first tip 3a and the second tip 3b shown in FIG. 2A, respectively. In the event that the free layer pattern 54a is an SAF layer, the free layer pattern 54a may be considered as the lower ferromagnetic layer 49a shown in FIG. 3. In this case, the magnetic spins in the lower ferromagnetic layer 49a include first magnetic spins S1 in the main body 1', second magnetic spins S2 in the first tip 3a', and third magnetic spins S3 in the second tip 3b'.

In general, an array direction of magnetic spins in a ferromagnetic layer depends on a shape of the ferromagnetic layer. For example, when any external magnetic field is not applied to the ferromagnetic layer, the magnetic spins in the ferromagnetic layer tend to be arrayed toward a length direction of the ferromagnetic layer in order to have their stable states. Accordingly, the first magnetic spins S1 in the lower ferromagnetic layer 49a shown in FIG. 6 may be arrayed to be parallel with the length direction of the main body 1', namely, an x axis. Also, the second magnetic spins S2 are arrayed to have a state rotated from the x-axis toward a positive y-axis by a certain angle, and the third magnetic spins S3 are arrayed to have a state rotated from the x-axis toward a negative y-axis by a certain angle. As a result, the first to third magnetic spins S1, S2 and S3 create a circular magnetic field Hc to maintain highly stable states, as shown in FIG. 6. That is, the magnetic spins in the free layer pattern of the magnetic tunnel junction structure according to the present invention have more stable states as compared to a conventional magnetic tunnel junction structure having a rectangular shaped free layer or an ellipse shaped free layer in an equilibrium state where any external magnetic field is not applied.

In order to convert data of the magnetic tunnel junction structure (5 in FIGS. 2A, 2B and 3) having the lower ferromagnetic layer 49a, the magnetic spins S1, S2 and S3 should be rotated by 180°. In order to rotate the magnetic spins S1, S2 and S3 by 180°, a hard magnetic field Hh that is parallel with the y-axis and an easy magnetic field He that is anti-parallel with the x-axis must be applied to the lower ferromagnetic layer 49a. The hard magnetic field Hh may be created by forcing a first writing current into the bit line BL shown in FIGS. 2A and 3, and the easy magnetic field He may be created by forcing a second write current into the digit line DL shown in FIGS. 2A and 3. In this case, the first and third magnetic spins S1 and S3, in particular, the third magnetic spins S3, should be primarily arrayed to be parallel with the second magnetic spins S2. However, as described above, the initial magnetic spins S1, S2 and S3 have more stable state than the magnetic spins of the conventional magnetic tunnel junction structure. Accordingly, a critical hard magnetic field larger than a specific value is required to array the first and third magnetic spins S1 and S3 to be parallel with the second magnetic spins S2. However, once the first and third magnetic spins S1 and S3 are arrayed to be parallel with the second magnetic spins S2, a minimum easy magnetic field for rotating the first to third magnetic spins S1, S2 and S3 to be anti-parallel with their initial states may be significantly smaller than an easy magnetic field for switching the conventional magnetic tunnel junction structure.

Figure 7:
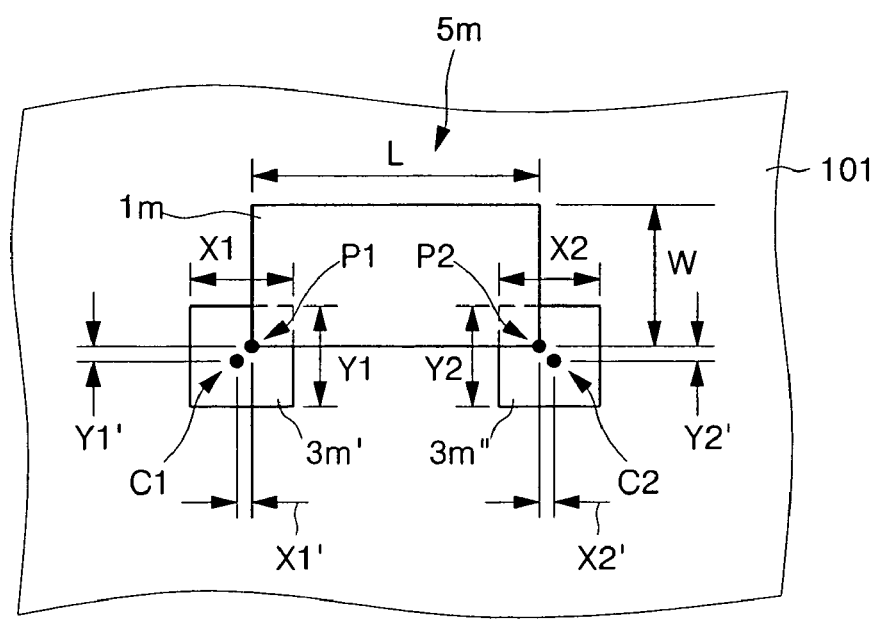
FIG. 7 is a plan view illustrating a photo mask used in formation of the free layer shown in FIG. 6.

FIG. 7 is a plan view illustrating a photo mask used in formation of the free layer shown in FIG. 6 or the magnetic tunnel junction structure shown in FIGS. 2A and 2B.

Referring to FIG. 7, a photo mask according to the present invention includes a transparent substrate 101 and a magnetic tunnel junction pattern 5m formed on a main surface of the transparent substrate 101. The magnetic tunnel junction pattern 5m includes a square-shaped main pattern 1m as well as first and second tip patterns 3m' and 3m'' attached to both ends of the main pattern 1m, respectively. In detail, the main pattern 1m may have a rectangular shape having a length L and a width W smaller than the length L. Also, the main pattern 1m has first and second sides that face each other, and third and fourth sides that face each other. The first and second sides may have the length L, and the third and fourth sides may have the width W. In this case, both ends of the first side or the second side correspond to first and second vertexes P1 and P2, respectively.

The first and second tip patterns 3m' and 3m'' are attached to the first and second vertexes P1 and P2, respectively. In detail, it is preferable that the first tip pattern 3m' is a square having a first width dimension X1 and a first length dimension Y1, and the second tip pattern 3m'' has a square having a second width dimension X2 and a second length dimension Y2. However, the first and second tip patterns 3m' and 3m'' may have a circular-shaped configuration. A portion of the first tip pattern 3m' may overlap a first corner region of the main pattern 1m including the first vertex P1, and a portion of the second tip pattern 3m'' may overlap a second corner region of the main pattern 1m including the second vertex P2. As a result, the first and second tip patterns 3m' and 3m'' are disposed to protrude from the first and second vertexes P1 and P2, respectively.

The first tip pattern 3m' may have the same dimension as the second tip pattern 3m''. That is, the first width dimension X1 may be the same as the second width dimension X2, and the first length dimension Y1 may be the same as the second length dimension Y2. Further, the first tip pattern 3m' may be disposed to be symmetrical to the second tip pattern 3m'' with respect to a straight line crossing a center point of the main pattern 1m. Center points C1 and C2 of the first and second tip patterns 3m' and 3m'' may be located outside the main pattern 1m, as shown in FIG. 7. In this case, X and Y components of a distance between the first center point C1 and the first vertex P1 are X1' and Y1', respectively, and X and Y components of a distance between the second center point C2 and the second vertex P2 are X2' and Y2', respectively. The first center point C1 may not be located on extension lines of the second side (or the first side) and the third side that are in contact with the first vertex P1, as shown in FIG. 7. Similarly, the second center point C2 may also not be located on extension lines of the second side (or the first side) and the fourth side that are in contact with the second vertex P2, as shown in FIG. 7.

The first width dimension X1 may be the same as the first length dimension Y1, and the second width dimension X2 may be the same as the second length dimension Y2. That is, both the first and second tip patterns 3m' and 3m" may be squares. In particular, the first and second tip patterns 3m' and 3m" may be squares having the same dimension. Alternatively, the first and second tip patterns 3m' and 3m" may have a rectangular shape having the same dimension. That is, the first and second width dimensions X1 and X2 may be different from the first and second length dimensions Y1 and Y2.

The main pattern 1m, the first tip pattern 3m' and the second tip pattern 3m" may be opaque patterns. For example, the patterns 1m, 3m', and 3m" may be chrome patterns.

FIGS. 8 to 11 are cross-sectional views taken along the line I-I' of FIG. 2A, illustrating methods of fabricating MRAM cells that employ magnetic tunnel junction structures according to embodiments of the present invention.

Figure 8:
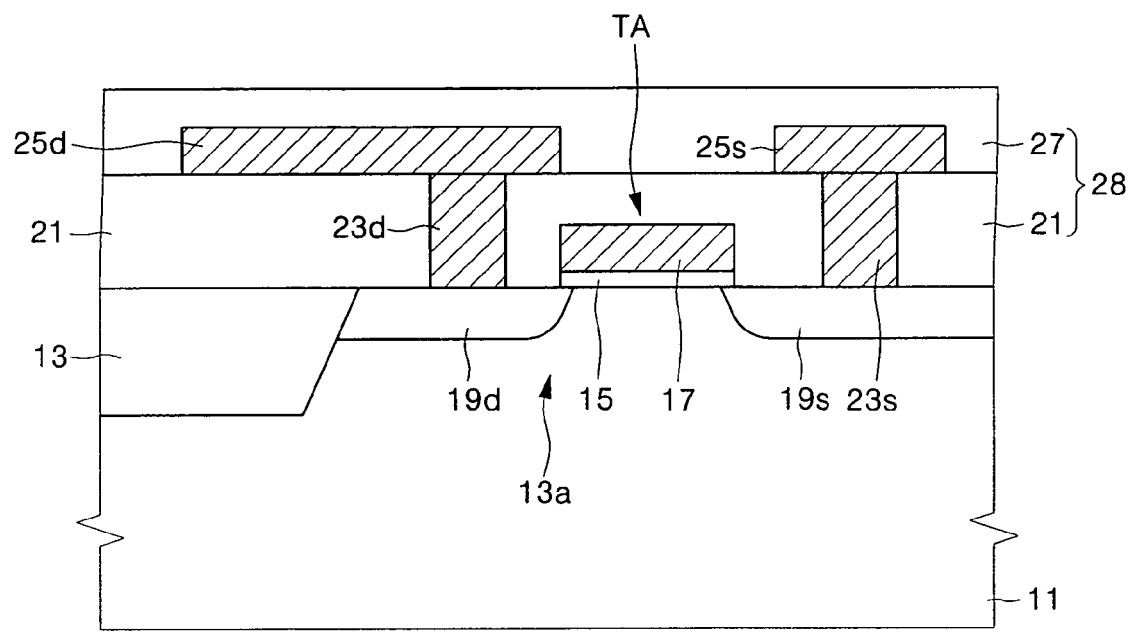
FIGS. 8 to 11 are cross-sectional views illustrating methods of forming MRAM cells according to embodiments of the present invention.

Referring to FIG. 8, an isolation layer 13 is formed at a predetermined region of an integrated circuit substrate 11 to define an active region 13a. An access transistor TA is formed at the active region 13a using typical processes, which are well known in the art. The access transistor TA may be a MOS transistor formed to have a source region 19s and a drain region 19d spaced apart from each other, and a gate electrode 17 disposed over a channel region between the source region 19s and drain region 19d, as shown in FIG. 8. The gate electrode 17 may be formed to cross over the active region 13a. In this case, the gate electrode 17 extends to serve as a word line. The gate electrode 17 is insulated from the active region 13a by a gate insulating layer 15.

A first lower interlayer insulating layer 21 is formed on the substrate having the access transistor TA. The first lower interlayer insulating layer 21 is patterned to form a source contact hole and a drain contact hole that expose the source region 19s and the drain region 19d, respectively. A source contact plug 23s and a drain contact plug 23d are formed in the source contact hole and the drain contact hole, respectively. A conductive layer is formed on the substrate having the contact plugs 23s and 23d, and the conductive layer is patterned to form a drain pad 25d contacting the drain contact plug 23d and a common source line 25s contacting the source contact plug 23s. The common source line 25s may be formed to be parallel with the extended gate electrode 17. A first upper interlayer insulating layer 27 is formed on the substrate having the drain pad 25d and the common source line 25s. The first lower interlayer insulating layer 21 and the first upper interlayer insulating layer 27 constitute a first interlayer insulating layer 28.

Figure 9:
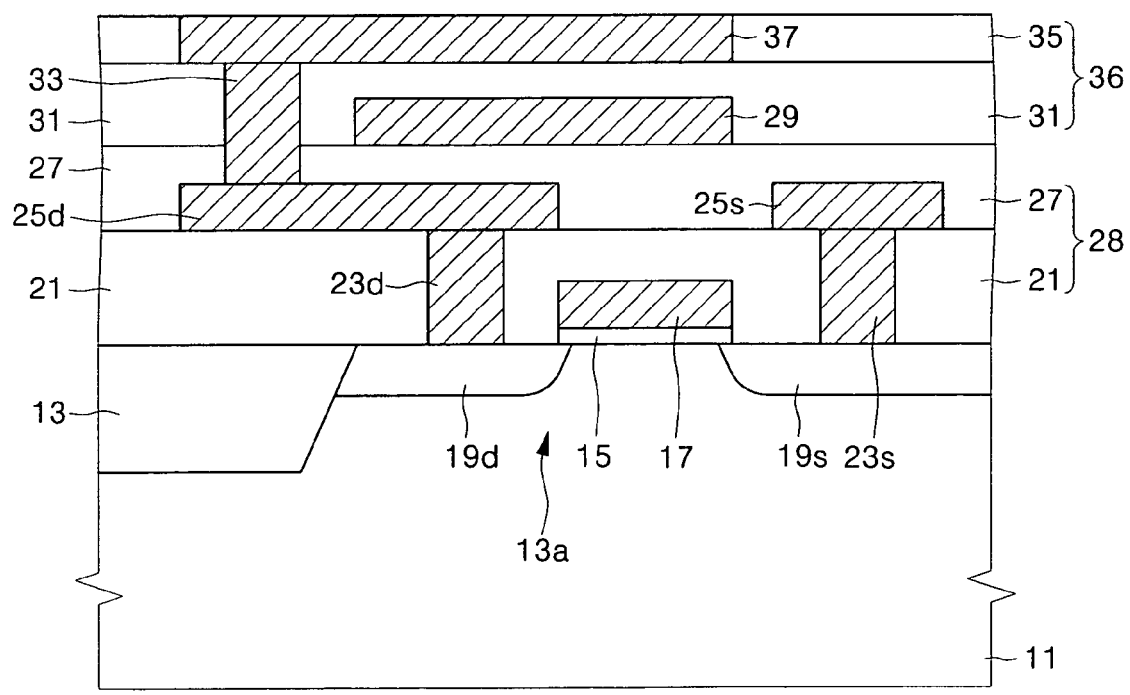

Referring to FIG. 9, a digit line 29 is formed on the first upper interlayer insulating layer 27. The digit line 29 may be formed to be parallel with the gate electrode 17. A second lower interlayer insulating layer 31 is formed on the substrate having the digit line 29. The second lower interlayer insulating layer 31 and the first upper interlayer insulating layer 27 are patterned to form a bottom electrode contact hole that exposes the drain pad 25d, and a bottom electrode contact plug 33 is formed in the bottom electrode contact hole. A second upper interlayer insulating layer 35 is then formed on the substrate having the bottom electrode contact plug 33. The second lower interlayer insulating layer 31 and the second upper interlayer insulating layer 35 constitute a second interlayer insulating layer 36. The second upper interlayer insulating layer 35 is patterned to form a groove that exposes the bottom electrode contact plug 33 and overlaps with a portion of the digit line 29. A bottom electrode 37 is formed in the groove. The bottom electrode 37 may be formed using a typical damascene technique.

Figure 10:
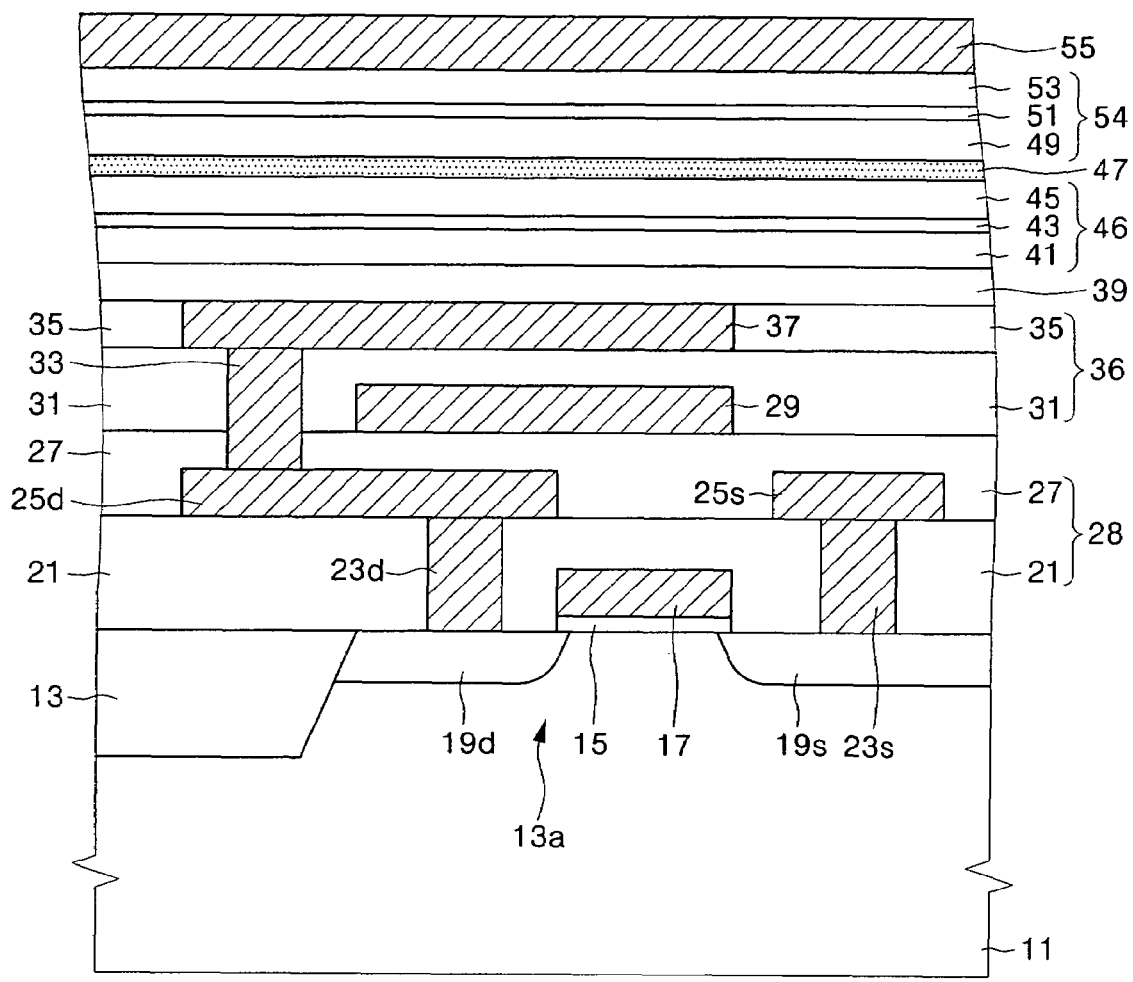

Referring to FIG. 10, a pinning layer 39, a pinned layer 46, a tunneling layer 47, a free layer 54 and a top electrode layer 55 are sequentially formed on the substrate having the bottom electrode 37. On the contrary, the free layer 54, the tunneling layer 47, the pinned layer 46, the pinning layer 39 and the top electrode layer 55 may be sequentially formed on the substrate having the bottom electrode 37. The pinning layer 39 may be formed of an anti-ferromagnetic layer such as a PtMn layer, and the tunneling layer 47 may be formed of an insulating layer such as an aluminum oxide ($Al_2O_3$) layer. Further, the pinned layer 46 may be formed of a single ferromagnetic layer or a synthetic anti-ferromagnetic (SAF) layer. The single ferromagnetic layer may be formed of a ferromagnetic layer such as a cobalt iron (CoFe) layer or a nickel iron (NiFe) layer using a sputtering technique. When the pinned layer 46 is formed of the SAF layer, the pinned layer 46 may be formed by sequentially stacking a lower ferromagnetic layer 41, an anti-ferromagnetic coupling spacer layer 43 and an upper ferromagnetic layer 45. The lower ferromagnetic layer 41 and the upper ferromagnetic layer 45 may be formed of a CoFe layer or a NiFe layer, and the anti-ferromagnetic coupling spacer layer 43 may be formed of a ruthenium (Ru) layer.

In addition, the free layer 54 may also be formed of a single ferromagnetic layer or a synthetic anti-ferromagnetic (SAF) layer. In this case, the single ferromagnetic layer may be formed of a cobalt iron (CoFe) layer or a NiFe layer. When the free layer 54 is formed of the SAF layer, the free layer 54 may also be formed by sequentially stacking a lower ferromagnetic layer 49, an anti-ferromagnetic coupling spacer layer 51 and an upper ferromagnetic layer 53. The lower ferromagnetic layer 49 and the upper ferromagnetic layer 53 may be formed of a CoFe layer, a NiFe layer or a CoNiFe layer, and the anti-ferromagnetic coupling spacer layer 51 may be formed of a ruthenium (Ru) layer.

Figure 11:
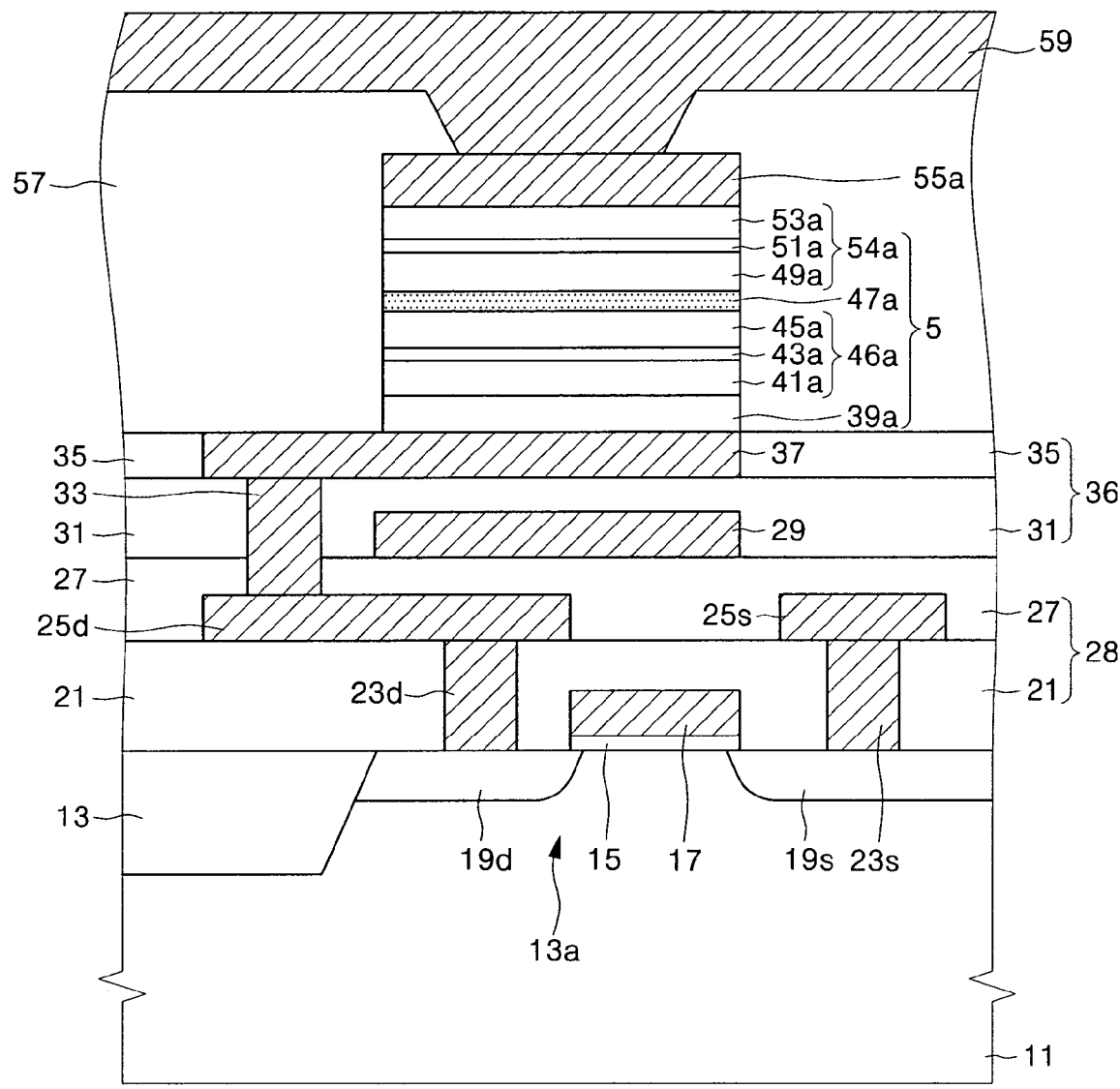

Referring to FIG. 11, at least the top electrode layer 55 and the free layer 54 may be patterned using the photo mask shown in FIG. 7. As a result, a top electrode 55a and a free layer pattern 54a having the plan view of FIG. 6 are formed over the bottom electrode 37. Alternatively, the top electrode layer 55, the free layer 54, the tunneling layer 47, the pinned layer 46 and the pinning layer 39 may be successively patterned using the photo mask of FIG. 7. In this case, a pinning layer pattern 39a, a pinned layer pattern 46a and a tunneling insulation layer pattern 47a as well as the free layer pattern 54a and the top electrode 55a are formed on the bottom electrode 37 to have the same plan view as the structure shown in FIG. 2B. The pinning layer pattern 39a, the pinned layer pattern 46a, the tunneling insulation layer pattern 47a, and the free layer pattern 54a constitute a magnetic tunnel junction structure 5.

When the pinned layer 46 is formed of the SAF layer as described above, the pinned layer pattern 46a is formed to have a lower ferromagnetic layer pattern 41a, an anti-ferromagnetic coupling spacer layer pattern 43a, and an upper ferromagnetic layer pattern 45a, which are sequentially stacked. Similarly, when the free layer 54 is formed of the SAF layer as described above, the free layer pattern 54a is formed to have a lower ferromagnetic layer pattern 49a, an anti-ferromagnetic coupling spacer layer pattern 51a and an upper ferromagnetic layer pattern 53a, which are sequentially stacked.

A third interlayer insulating layer 57 is formed on the substrate having the magnetic tunnel junction structure 5 and the top electrode 55a. The third interlayer insulating layer 57A is patterned to form a bit line contact hole that exposes the top electrode 55a. A conductive layer, such as an aluminum layer, is formed on the substrate having the bit line contact hole, and the conductive layer is patterned to formed a bit line 59, which is electrically connected to the top electrode 55a via the bit line contact hole. The bit line 59 is formed to cross over the digit line 29.

EXAMPLES

Hereinafter, switching characteristics of magnetic tunnel junction structures fabricated according to the above-described embodiments and the conventional art will be described.

Figure 12:
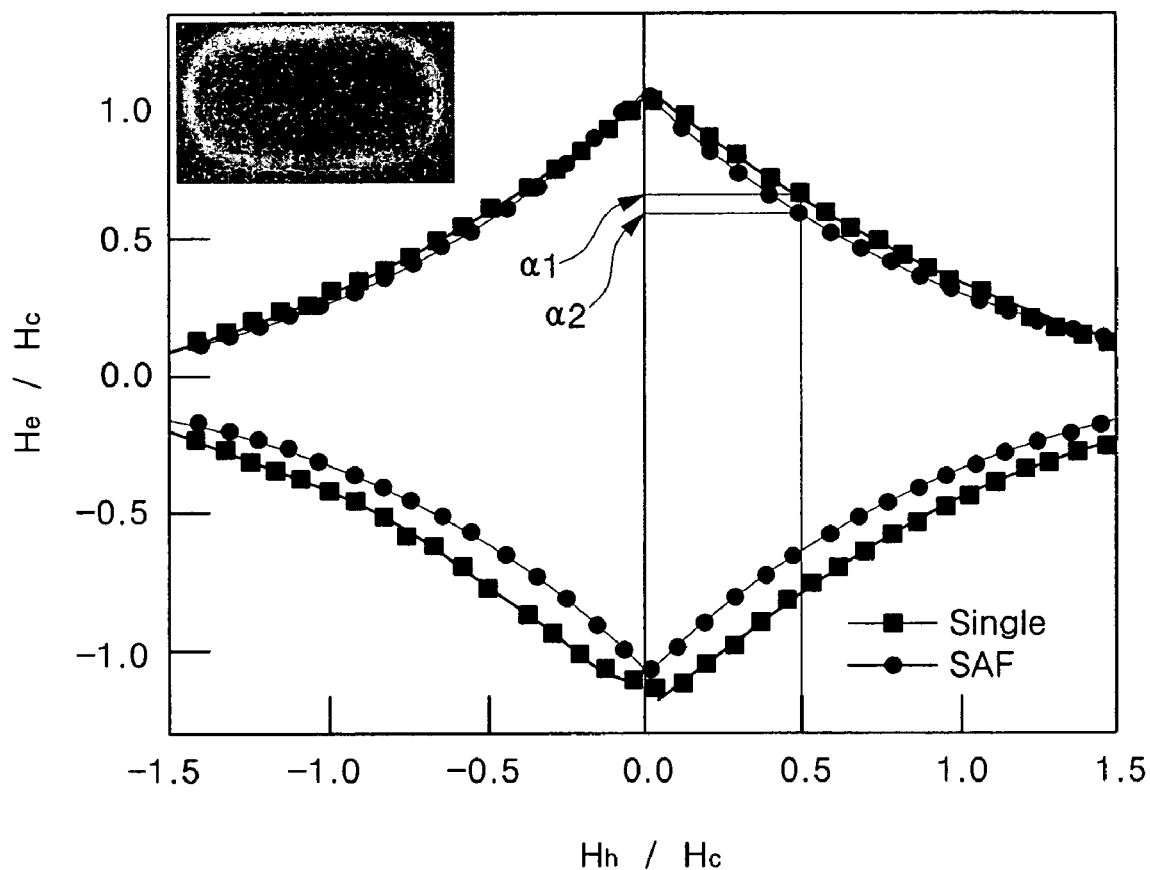
FIG. 12 contains asteroidal curves illustrating measurement results of switching characteristics of conventional magnetic tunnel junction structures.

FIG. 12 is a graph illustrating measurement results of asteroid curves that exhibit switching characteristics of magnetic tunnel junction structures fabricated according to a conventional art. In FIG. 12, the abscissa denotes a normalized hard magnetic field Hh/Hc with respect to a coercive magnetic field Hc, and the ordinate denotes a normalized easy magnetic field He/Hc with respect to the coercive magnetic field Hc. Here, the coercive magnetic field Hc means a minimum easy magnetic field required to switch the conventional magnetic tunnel junction structure without any application of the hard magnetic field.

Conventional magnetic tunnel junction structures exhibiting the measurement results of FIG. 12 were fabricated to have a rectangular shape when viewed from a plan view. In detail, the rectangular magnetic tunnel junction (MTJ) structures were patterned using a photo mask that has a rectangular magnetic tunnel junction pattern with a length of 0.8 μm and a width of 0.4 μm.

Further, the rectangular magnetic tunnel junction structures were fabricated to have a pinning layer pattern, a pinned layer pattern, a tunneling insulation layer pattern and a free layer pattern, which are sequentially stacked. In this case, the pinning layer pattern was formed of a PtMn layer having a thickness of 150 Å, and the tunneling insulation layer pattern was formed of an aluminum oxide layer having a thickness of 12 Å. Also, the pinned layer pattern was formed of a synthetic anti-ferromagnetic (SAF) layer. In detail, the SAF pinned layer pattern was formed by sequentially stacking a lower CoFe layer having a thickness of 30 Å, a ruthenium layer having a thickness of 8 Å, and an upper CoFe layer having a thickness of 30 Å.

In FIG. 12, data denoted by a reference character "■" corresponds to an asteroidal curve of a conventional magnetic tunnel junction structure having a free layer pattern formed of a single ferromagnetic layer, and data denoted by a reference character "●" corresponds to an asteroidal curve of a conventional magnetic tunnel junction structure having a free layer pattern formed of an SAF layer. In this case, the single free layer pattern was formed of a CoNiFe layer having a thickness of 30 Å, and the SAF free layer pattern was formed by sequentially stacking a lower CoNiFe layer having a thickness of 40 Å, a ruthenium layer having a thickness of 8 Å, and an upper CoNiFe layer having a thickness of 20 Å.

Referring to FIG. 12, when a hard magnetic field corresponding to a half of the coercive magnetic field Hc is applied to the conventional magnetic tunnel junction structure having the single free layer pattern, the conventional magnetic tunnel junction structure having the single free layer pattern was switched with an easy magnetic field corresponding to at least 0.63 times the coercive magnetic field Hc (see α1 in FIG. 12).

Also, when a hard magnetic field corresponding to a half of the coercive magnetic field Hc is applied to the conventional magnetic tunnel junction structure having the SAF free layer pattern, the conventional magnetic tunnel junction structure having the SAF free layer pattern was switched with an easy magnetic field corresponding to at least 0.57 times the coercive magnetic field Hc (see α2 in FIG. 12). Here, the factors "α1" and "α2" correspond to numerals of evaluating a writing margin of the magnetic tunnel junction structures. That is, the more the factor decreases, the more the writing margin increases.

Figure 13:
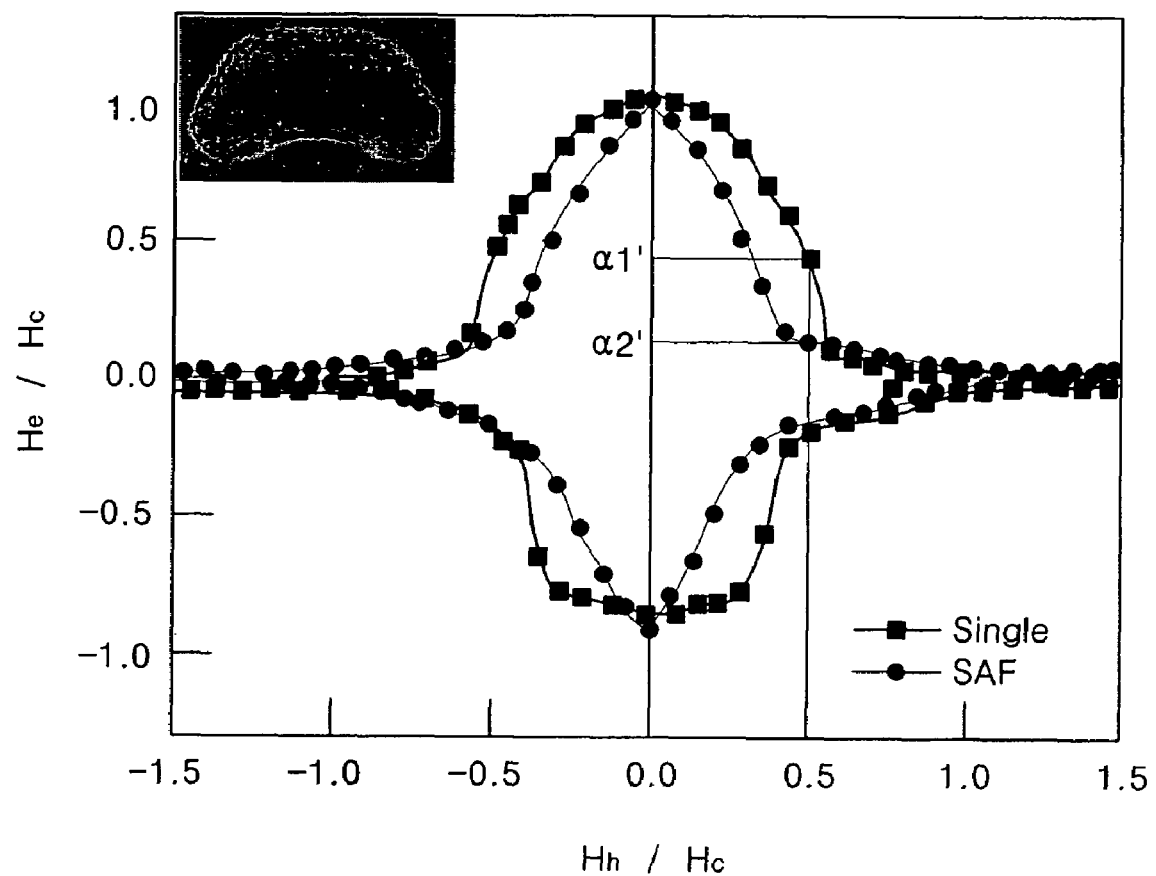
FIG. 13 contains asteroidal curves showing measurement results of switching characteristics of magnetic tunnel junction structures fabricated according to the present invention.

FIG. 13 is a graph illustrating measurement results of asteroid curves that exhibit switching characteristics of magnetic tunnel junction structures fabricated according to embodiments of the present invention. In FIG. 13, the abscissa and the ordinate denote the same parameters as the abscissa and the ordinate of FIG. 12, respectively. Further, the magnetic tunnel junction structures fabricated according to the present invention are different from the conventional magnetic tunnel junction structures in a planar shape of the magnetic tunnel junction structures. In detail, the magnetic tunnel junction structures according to the present invention were fabricated using the photo mask shown in FIG. 7. In this case, a magnetic tunnel junction pattern 5m of the photo mask was made to have dimensions described in the following Table 1.

TABLE 1

| Main pattern (1 m) | | Tip patterns (3 m', 3 m") | | | |
|---|---|---|---|---|---|
| L | W | X1 (= X2) | Y1 (= Y2) | X1' (= X2') | Y1' (= Y2') |
| 0.8 μm | 0.4 μm | 0.3 μm | 0.15 μm | 0.06 μm | 0.06 μm |

Referring to FIG. 13, when a hard magnetic field corresponding to a half of the coercive magnetic field Hc is applied to the magnetic tunnel junction structure having the single free layer pattern, the magnetic tunnel junction structure was switched with an easy magnetic field corresponding to 0.43 times the coercive magnetic field Hc (see α1' in FIG. 13). Also, when a hard magnetic field corresponding to a half of the coercive magnetic field Hc is applied to the magnetic tunnel junction structure having the SAF free layer pattern, the magnetic tunnel junction structure was switched with an easy magnetic field corresponding to 0.13 times the coercive magnetic field Hc (see α2' in FIG. 13). As a result, the magnetic tunnel junction structures according to the present invention exhibited an improved writing margin as compared to the conventional magnetic tunnel junction structure. In particular, when the magnetic tunnel junction structure according to the present invention employs the SAF free layer pattern, the writing margin of the magnetic tunnel junction structure was significantly enhanced.

Figure 14:
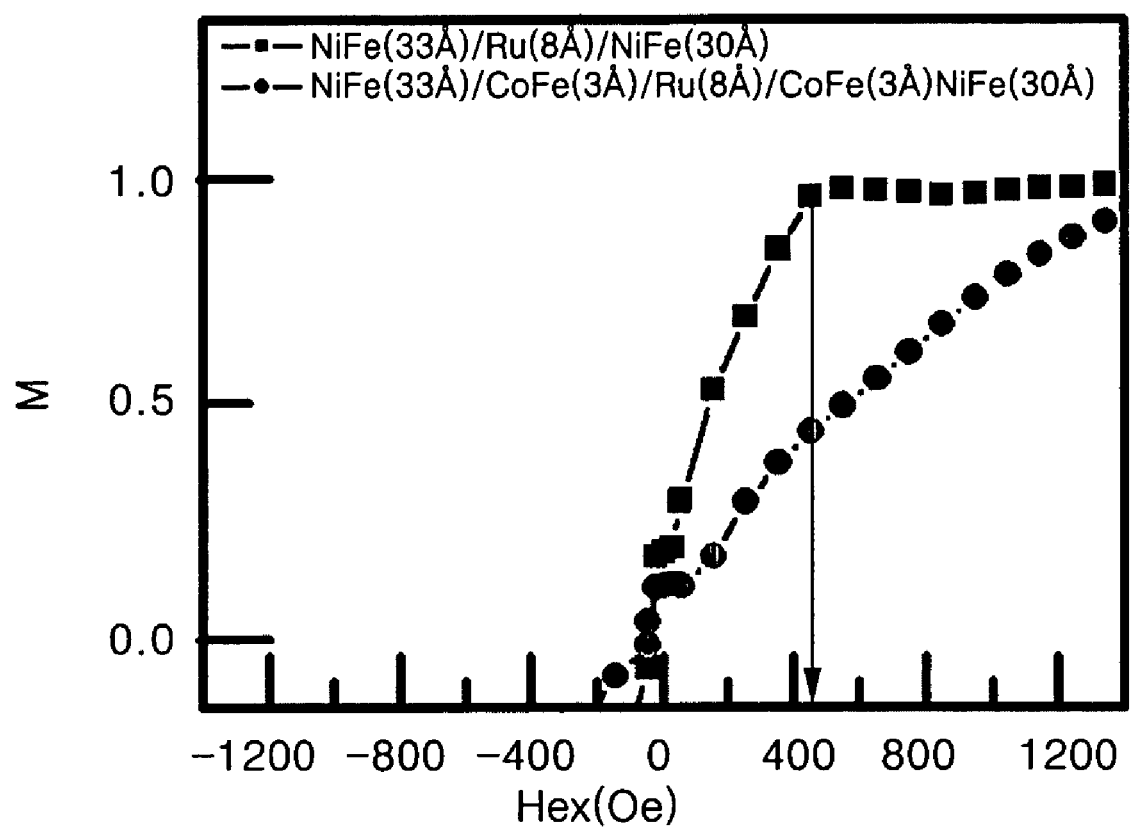
FIG. 14 is a graph illustrating measurement results of magnetization characteristics of a three-layered SAF layer shown in FIG. 3 and a hybrid synthetic anti-ferromagnetic layer shown in FIG. 5.

FIG. 14 is a graph illustrating measurement results of magnetization characteristic curves of a three-layered SAF layer and a hybrid SAF layer according to embodiments of the present invention. In FIG. 14, the abscissa denotes an external magnetic field Hex applied to the SAF layers, and the ordinate denotes normalized magnetization M.

In FIG. 14, data denoted by a reference character "■" denotes a magnetization characteristic curve of the three-layered SAF layer, and data denoted by a reference character "●" denotes a magnetization characteristic curve of the hybrid SAF layer. The three-layered SAF layer was formed by sequentially stacking a lower NiFe layer having a thickness of 33 Å, a ruthenium layer having a thickness of 8 Å and an upper NiFe layer having a thickness of 30 Å on an entire surface of a substrate. Further, the hybrid SAF layer was formed by sequentially stacking a lower NiFe layer having a thickness of 33 Å, a lower CoFe layer having a thickness of 3 Å, a ruthenium layer having a thickness of 8 Å, an upper CoFe layer having a thickness of 3 Å, and an upper NiFe layer having a thickness of 30 Å on an entire surface of a substrate.

Referring to FIG. 14, when an external magnetic field Hex of about 450 (Oe) is applied to the three-layered SAF layer, the three-layered SAF layer exhibited a normalized magnetization M of "1." On the contrary, the hybrid SAF layer exhibited a normalized magnetization M of "1" under an external magnetic field Hex higher than about 1400 (Oe). Here, when all magnetic spins in an upper ferromagnetic layer of the SAF layers are arrayed to be completely parallel with all magnetic spins in their lower ferromagnetic layer, the normalized magnetization M has a value of "1." As a result, in order to forcibly array the magnetic spins in all ferromagnetic layers of the hybrid SAF layer to be parallel with one another, an external magnetic field Hex stronger than 1400 (Oe) was required, and in order to forcibly array the magnetic spins in all ferromagnetic layers of the three-layered SAF layer to be parallel with one another, an external magnetic field as weak as about 450 (Oe) was required. This means that the hybrid SAF layer has higher exchange coupling energy (negative Jex in FIG. 4) as compared to the three-layered SAF layer. That is, it will be appreciated that the hybrid SAF layer has excellent characteristics over the three-layered SAF layer.

As described above, according to the present invention, at least the free layer pattern has a main body of a square shape, and a pair of bended tips protruded from both ends of the main body respectively when viewed from a plan view. Accordingly, magnetic spins in the free layer pattern create a circular magnetic field to remain a stable state in an equilibrium state where any external magnetic field is not applied. In addition, the bended tips provide a significantly enhanced writing margin.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A magnetic tunnel junction structure having a pinned layer pattern, a tunneling insulation layer pattern and a free layer pattern, which are stacked on an integrated circuit substrate, at least the free layer pattern comprising:

a rectangular main body having first and second sides that face each other, the first side of the main body being along an outer surface of at least the free layer pattern, a third side extended from one end of the first side to contact one end of the second side, and a fourth side extended from the other end of the first side to contact the other end of the second side;

a first tip protruding from a first vertex corresponding to a contact point of the second and third sides, an outer surface of the first tip contacting the second and third sides, and the first tip being bent to have a configuration of a rounded curve, wherein the first vertex is on a same side of the first tip as a center of curvature of the rounded curve of the first tip; and a second tip protruding from a second vertex corresponding to a contact point of the second and fourth sides, an outer surface of the second tip contacting the second and fourth sides, and the second tip being bent to have a configuration of a rounded curve, wherein the second vertex is on a same side of the second tip as a center of curvature of the rounded curve of the second tip, and wherein the first and second tips expose the first and second sides.

2. The magnetic tunnel junction structure according to claim 1, wherein the first and second sides are longer than the third and fourth sides.

3. The magnetic tunnel junction structure according to claim 2, wherein the first side has the same length as the second side, and the third side has the same length as the fourth side.

4. The magnetic tunnel junction structure according to claim 1, wherein the tunneling insulation layer pattern is interposed between the free layer pattern and the pinned layer pattern, and the tunneling insulation layer pattern and the pinned layer pattern have the same configuration as the free layer pattern.

5. The magnetic tunnel junction structure according to claim 4, further comprising a pinning layer pattern in contact with the pinned layer pattern and located opposite the tunneling insulation layer pattern.

6. The magnetic tunnel junction structure according to claim 1, wherein the pinned layer pattern is a single ferromagnetic layer.

7. The magnetic tunnel junction structure according to claim 1, wherein the pinned layer pattern is a synthetic anti-ferromagnetic (SAF) layer.

8. The magnetic tunnel junction structure according to claim 1, wherein the pinned layer pattern is a hybrid synthetic anti-ferromagnetic (SAF) layer composed of at least five layers.

9. The magnetic tunnel junction structure according to claim 8, wherein the hybrid synthetic anti-ferromagnetic layer includes a lower CoFeB layer, a lower CoFe layer, an anti-ferromagnetic coupling spacer layer, an upper CoFe layer and an upper CoFeB layer, which are sequentially stacked, and the anti-ferromagnetic coupling spacer layer is one of a ruthenium layer and a chrome layer.

10. The magnetic tunnel junction structure according to claim 8, wherein the hybrid synthetic anti-ferromagnetic layer includes a lower NiFe layer, a lower CoFe layer, an anti-ferromagnetic coupling spacer layer, an upper CoFe layer and an upper NiFe layer, which are sequentially stacked, and the anti-ferromagnetic coupling spacer layer is one of a ruthenium layer and a chrome layer.

11. The magnetic tunnel junction structure according to claim 1, wherein the free layer pattern is a single ferromagnetic layer.

12. The magnetic tunnel junction structure according to claim 1, wherein the free layer pattern is a synthetic anti-ferromagnetic (SAF) layer.

13. The magnetic tunnel junction structure according to claim 1, wherein the free layer pattern is a hybrid synthetic anti-ferromagnetic (SAF) layer composed of at least five layers.

14. The magnetic tunnel junction structure according to claim 13, wherein the hybrid synthetic anti-ferromagnetic layer includes a lower CoFeB layer, a lower CoFe layer, an anti-ferromagnetic coupling spacer layer, an upper CoFe layer and an upper CoFeB layer, which are sequentially stacked, and the anti-ferromagnetic coupling spacer layer is one of a ruthenium layer and a chrome layer.

15. The magnetic tunnel junction structure according to claim 13, wherein the hybrid synthetic anti-ferromagnetic layer includes a lower NiFe layer, a lower CoFe layer, an anti-ferromagnetic coupling spacer layer, an upper CoFe layer and an upper NiFe layer, which are sequentially stacked, and the anti-ferromagnetic coupling spacer layer is one of a ruthenium layer and a chrome layer.

16. The magnetic tunnel junction structure according to claim 1, wherein the one end of the first side abuts the first tip, and the other end of the first side abuts the second tip, the first side comprising a surface between the one end and the other end, wherein the surface is along an outer edge of the free layer pattern.

17. The magnetic tunnel junction structure according to claim 1, wherein the first and second tips are located to face each other.

18. A magnetic random access memory (MRAM) cell, comprising:
an access transistor formed on an integrated circuit substrate;
a digit line disposed over the substrate;
a bottom electrode disposed over the digit line and electrically connected to an output terminal of the access transistor;
a magnetic tunnel junction structure including a pinned layer pattern, a tunneling insulation layer pattern and a free layer pattern, which are stacked on the bottom electrode, at least the free layer pattern including a rectangular main body as well as first and second tips that protrude from both ends of the main body, respectively, the main body having first and second sides that face each other, the first side of the main body being along an outer surface of at least the free layer pattern, a third side extended from one end of the first side to contact one end of the second side and a fourth side extended from the other end of the first side to contact the other end of the second side, the first tip protruding from a first vertex corresponding to a contact point of the second and third sides, an outer surface of the first tip contacting the second and third sides, and the first tip being bent to have a configuration of a rounded curve, wherein the first vertex is on a same side of the first tip as a center of curvature of the rounded curve of the first tip, and the second tip protruding from a second vertex corresponding to a contact point of the second and fourth sides, an outer surface of the second tip contacting the second and fourth sides, and the second tip being bent to have a configuration of a rounded curve, wherein the second vertex is on a same side of the second tip as a center of curvature of the rounded curve of the second tip, and wherein the first and second tips expose the first and second sides;
a top electrode disposed on the magnetic tunnel junction structure; and
a bit line disposed over the top electrode and electrically connected to the top electrode.

19. The MRAM cell according to claim 18, further comprising:
an isolation layer formed at a predetermined region of the integrated circuit substrate to define an active region, the access transistor being a MOS transistor having a source region and a drain region formed in the active region as well as a gate electrode disposed to cross over a channel region between the source and drain regions, and the output terminal being the drain region of the MOS transistor.

20. The MRAM cell according to claim 18, wherein the main body has a rectangular shape, and the first and second sides are longer than the third and fourth sides.

21. The MRAM cell according to claim 18, wherein the tunneling insulation layer pattern is interposed between the free layer pattern and the pinned layer pattern, and the tunneling insulation layer pattern and the pinned layer pattern have the same configuration as the free layer pattern.

22. The MRAM cell according to claim 21, further comprising a pinning layer pattern interposed between the bottom electrode and the pinned layer pattern.

23. The MRAM cell according to claim 18, wherein the pinned layer pattern is a single ferromagnetic layer.

24. The MRAM cell according to claim 18, wherein the pinned layer pattern is a synthetic anti-ferromagnetic (SAF) layer.

25. The MRAM cell according to claim 18, wherein the pinned layer pattern is a hybrid synthetic anti-ferromagnetic (SAF) layer composed of at least five layers.

26. The MRAM cell according to claim 25, wherein the hybrid synthetic anti-ferromagnetic layer includes a lower CoFeB layer, a lower CoFe layer, an anti-ferromagnetic coupling spacer layer, an upper CoFe layer and an upper CoFeB layer, which are sequentially stacked, and the anti-ferromagnetic coupling spacer layer is one of a ruthenium layer and a chrome layer.

27. The MRAM cell according to claim 25, wherein the hybrid synthetic anti-ferromagnetic layer includes a lower NiFe layer, a lower CoFe layer, an anti-ferromagnetic coupling spacer layer, an upper CoFe layer and an upper NiFe layer, which are sequentially stacked, and the anti-ferromagnetic coupling spacer layer is one of a ruthenium layer and a chrome layer.

28. The MRAM cell according to claim 18, wherein the free layer pattern is a single ferromagnetic layer.

29. The MRAM cell according to claim 18, wherein the free layer pattern is a synthetic anti-ferromagnetic (SAF) layer.

30. The MRAM cell according to claim 18, wherein the free layer pattern is a hybrid synthetic anti-ferromagnetic (SAF) layer composed of at least five layers.

31. The MRAM cell according to claim 30, wherein the hybrid synthetic anti-ferromagnetic (SAF) layer includes a lower CoFeB layer, a lower CoFe layer, an anti-ferromagnetic coupling spacer layer, an upper CoFe layer and an upper CoFeB layer, which are sequentially stacked, and the anti-ferromagnetic coupling spacer layer is one of a ruthenium layer and a chrome layer.

32. The MRAM cell according to claim 30, wherein the hybrid synthetic anti-ferromagnetic layer includes a lower NiFe layer, a lower CoFe layer, an anti-ferromagnetic coupling spacer layer, an upper CoFe layer and an upper NiFe layer, which are sequentially stacked, and the anti-ferromagnetic coupling spacer layer is one of a ruthenium layer and a chrome layer.

33. The MRAM cell according to claim 18, wherein the one end of the first side abuts the first tip, and the other end of the first side abuts the second tip, the first side comprising a surface between the one end and the other end, wherein the surface is along an outer edge of the free layer pattern.

34. The MRAM cell according to claim 18, wherein the first and second tips are located to face each other.

* * * * *

UNITED STATES PATENT AND TRADEMARK OFFICE
CERTIFICATE OF CORRECTION

PATENT NO. : 7,582,890 B2
APPLICATION NO. : 11/103078
DATED : September 1, 2009
INVENTOR(S) : Ha et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 398 days.

Signed and Sealed this

Fourteenth Day of September, 2010

David J. Kappos
*Director of the United States Patent and Trademark Office*